US008987919B2

(12) United States Patent
Tanaka et al.

(10) Patent No.: US 8,987,919 B2
(45) Date of Patent: Mar. 24, 2015

(54) BUILT-IN ELECTRONIC COMPONENT SUBSTRATE AND METHOD FOR MANUFACTURING THE SUBSTRATE (71) Applicant: Shinko Electric Industries Co., Ltd., Nagano (JP)

(72) Inventors: Koichi Tanaka, Nagano (JP); Nobuyuki Kurashima, Nagano (JP); Hajime Iizuka, Nagano (JP); Satoshi Shiraki, Nagano (JP)

(73) Assignee: Shinko Electric Industries Co., Ltd., Nagano (JP)

( * ) Notice: Subject to any disclaimer, the term of this patent is extended or adjusted under 35 U.S.C. 154(b) by 0 days.

(21) Appl. No.: 14/150,952

(22) Filed: Jan. 9, 2014

(65) Prior Publication Data

US 2014/0210109 A1 Jul. 31, 2014

(30) Foreign Application Priority Data

Jan. 31, 2013 (JP) .................................. 2013-017749

(51) Int. Cl.
*H01L 23/12* (2006.01)
*H01L 21/56* (2006.01)
*H01L 21/52* (2006.01)
(Continued)

(52) U.S. Cl.
CPC ................ *H01L 21/56* (2013.01); *H01L 21/52* (2013.01); *H01L 2224/16225* (2013.01);
(Continued)

(58) Field of Classification Search
CPC ......... H01L 23/12; H01L 21/52; H01L 21/56; H01L 2225/06548; H01L 21/563; H01L 23/16; H01L 23/3121; H01L 23/3128; H01L 23/3135; H01L 23/3157
USPC .................................... 257/686, 778; 438/126
See application file for complete search history.

(56) References Cited

U.S. PATENT DOCUMENTS

2006/0151206 A1\* 7/2006 Maruyama et al. ........... 174/260
2011/0156264 A1\* 6/2011 Machida ....................... 257/773
(Continued)

FOREIGN PATENT DOCUMENTS

JP          2003-347722      12/2003

*Primary Examiner* — Peniel M Gumedzoe
(74) *Attorney, Agent, or Firm* — IPUSA, PLLC (57) ABSTRACT A built-in electronic component substrate includes a first substrate, an electronic component including side surfaces and mounted on the first substrate, a first resin provided on the first substrate and covering the side surfaces of the electronic component, a second substrate provided above the electronic component and the first resin and layered on the first substrate, a substrate connection member provided between the first and the second substrates and electrically connecting the first and the second substrates, a second resin filling in between the electronic component and the second substrate and in between the first resin and the second substrate, and a third resin filling in between the first and the second substrates and encapsulating the substrate connection member, the electronic component, the first resin, and the second resin.

15 Claims, 7 Drawing Sheets (51) Int. Cl.
  *H01L 23/14*     (2006.01)
  *H01L 23/498*    (2006.01)
  *H01L 23/538*    (2006.01)
  *H01L 25/10*     (2006.01)

(52) U.S. Cl.
  CPC .............. *H01L 2224/32225* (2013.01); *H01L 2224/48091* (2013.01); *H01L 2224/48227* (2013.01); *H01L 2224/48228* (2013.01); *H01L 2224/73204* (2013.01); *H01L 2224/83192* (2013.01); *H01L 23/145* (2013.01); *H01L 23/49816* (2013.01); *H01L 23/49822* (2013.01); *H01L 23/49827* (2013.01); *H01L 23/49833* (2013.01); *H01L 23/5389* (2013.01); *H01L 25/105* (2013.01)
  USPC ..................... 257/778; 257/686; 438/126

(56) References Cited

U.S. PATENT DOCUMENTS

2013/0077262 A1* 3/2013 Yamamoto et al. ........... 361/739
2013/0175702 A1* 7/2013 Choi et al. .................... 257/774

* cited by examiner

BUILT-IN ELECTRONIC COMPONENT SUBSTRATE AND METHOD FOR MANUFACTURING THE SUBSTRATE

CROSS-REFERENCE TO RELATED APPLICATIONS

This application is based upon and claims the benefit of priority of the prior Japanese Patent Application No. 2013-017749 filed on Jan. 31, 2013, the entire contents of which are incorporated herein by reference.

FIELD

The embodiments discussed herein are related to a built-in electronic component substrate and a method for manufacturing the substrate.

BACKGROUND

In recent years, for the purpose of, for example, size reduction or space reduction of substrates that include electronic components such as semiconductor chips, there is proposed a so-called "built-in electronic component type wiring substrate" that has an electronic component (e.g., semiconductor chip) installed therein (hereinafter also referred to as "built-in electronic component substrate").

One example of the built-in electronic component substrate includes a first substrate to which a semiconductor chip is flip-chip bonded in a face-down state and a second substrate layered on the first substrate interposed by a substrate connection member (e.g., solder ball), wherein the semiconductor chip is encapsulated with resin between the first and second substrates.

The processes for manufacturing the built-in electronic component substrate includes, for example, a process of manufacturing the first substrate onto which the semiconductor chip is mounted, a process of manufacturing the second substrate onto which the substrate connection member is mounted, and a process of layering the second substrate on the first substrate in a state where a substrate connection member mounting surface (i.e. surface for mounting the substrate connection member thereon) and a semiconductor chip mounting surface (i.e. surface for mounting the semiconductor chip thereon) face each other. After the above-described processes, a resin is supplied to fill in-between the first and the second substrates. Thereby, manufacturing of the built-in electronic-component substrate is completed.

[Patent Document 1]: Japanese Laid-Open Patent Publication No. 2003-347722

From the standpoint of reliability, resin is also supplied to fill in a space between a back surface of the semiconductor chip and the second substrate in the above-described resin filling-in process. Therefore, a sufficient space is to be provided between the back surface of the semiconductor chip and the second substrate, so that resin can fill in the space. Accordingly, the size of the substrate connection member is determined by taking into consideration the space between the back surface of the semiconductor chip and the second substrate. If the space between the back surface of the semiconductor chip and the second substrate becomes narrower than 40 µm, it becomes difficult for resin to fill the space. Therefore, the space between the back surface of the semiconductor chip and the second substrate is, normally, set to be greater than or equal to 40 µm.

In a case of attempting to reduce the thickness of a built-in electronic component substrate by reducing the space between the back surface of the semiconductor chip and the second substrate, there is a risk that resin cannot be sufficiently supplied to fill the space between the back surface of the semiconductor chip and the second substrate. If resin does not sufficiently fill in-between the back surface of the semiconductor chip and the second substrate, voids may be generated in the space between the back surface of the semiconductor chip and the second substrate. In a case where voids are generated, the voids may become enlarged by absorbing moisture. Thereby, peeling of resin may occur in the vicinity of the voids. As a result, reliability of the built-in electronic component substrate is degraded.

In other words, with a built-in electronic component substrate having the above-described configuration, a sufficient space between the back surface of the semiconductor chip and the second substrate becomes necessary for ensuring resin fillability with resin. Thus, the reduction of the thickness of the built-in electronic component substrate becomes difficult.

SUMMARY

According to an aspect of the invention, there is provided a built-in electronic component substrate including a first substrate, an electronic component including side surfaces and mounted on the first substrate, a first resin provided on the first substrate and covering the side surfaces of the electronic component, a second substrate provided above the electronic component and the first resin and layered on the first substrate, a substrate connection member provided between the first and the second substrates and electrically connecting the first and the second substrates, a second resin filling in between the electronic component and the second substrate and in between the first resin and the second substrate, and a third resin filling in between the first and the second substrates and encapsulating the substrate connection member, the electronic component, the first resin, and the second resin.

The object and advantages of the invention will be realized and attained by means of the elements and combinations particularly pointed out in the claims.

It is to be understood that both the foregoing general description and the following detailed description are exemplary and explanatory and are not restrictive of the invention as claimed.

DESCRIPTION OF EMBODIMENTS

Next, embodiments of the present invention are described with reference to the accompanying drawings. Throughout the drawings, like components/parts are denoted with like reference numerals. Thus, detailed descriptions of like components/parts denoted with like reference numerals are omitted.

First Embodiment

Structure of Built-in Electronic Component Type Substrate

Figure 1:
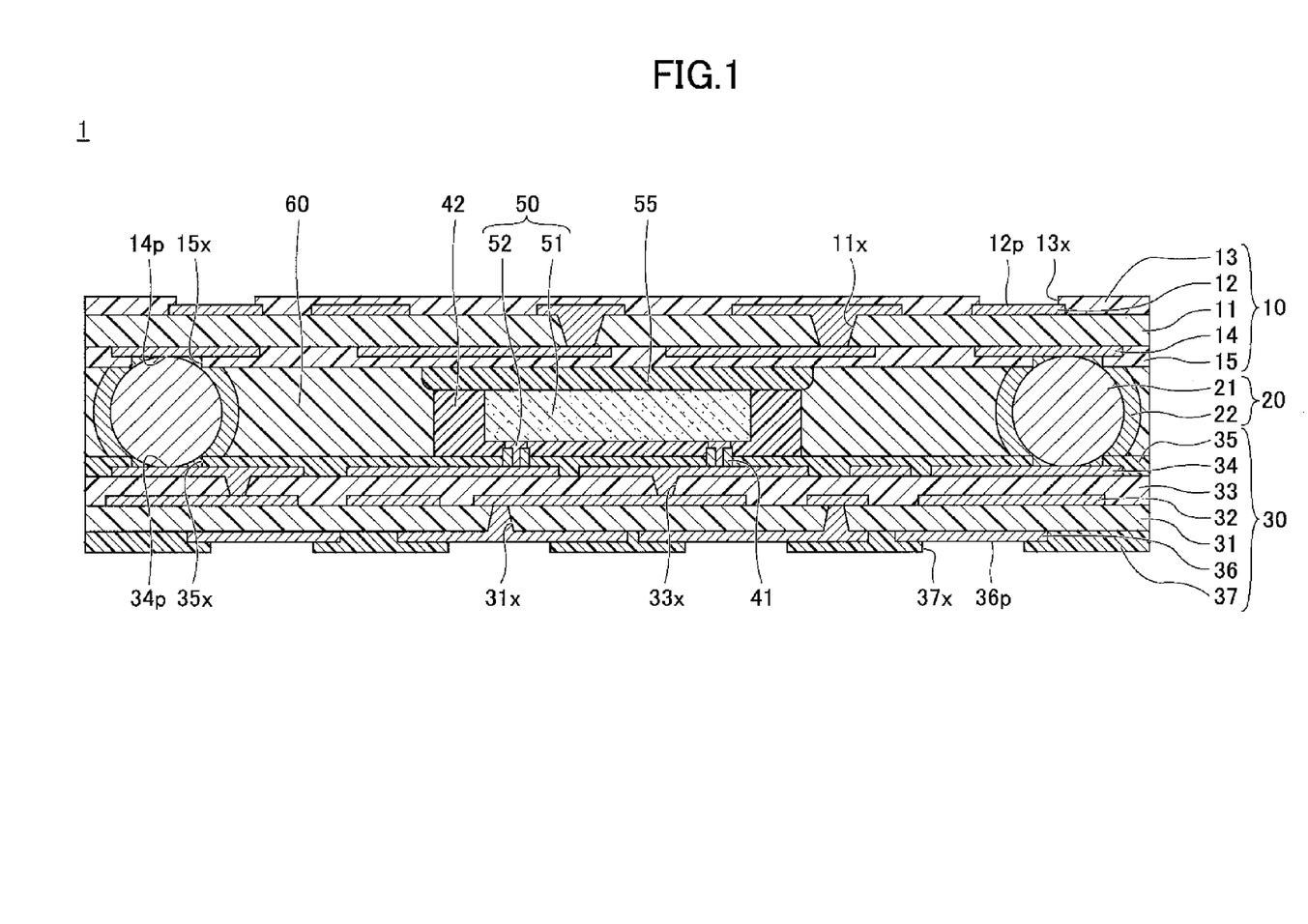
FIG. 1 is a cross-sectional view of a built-in electronic component substrate according to a first embodiment of the present invention.

First, a structure of a built-in electronic component substrate 1 according to a first embodiment of the present invention is described. FIG. 1 is a cross-sectional view of the built-in electronic component substrate 1 according to the first embodiment of the present invention.

With reference to FIG. 1, the built-in electronic component substrate 1 includes a substrate 10, a substrate connection member 20, a substrate 30, a bonding part 41, an underfill resin 42, a semiconductor chip 50, a resin film 55, and a molding resin 60. In the built-in electronic component substrate 1, the substrate 10 and the substrate 30 are layered interposed by the substrate connection member 20 that electrically connects the substrate 10 and the substrate 30. The substrate 30 is a representative example of a first substrate according to an embodiment of the present invention. The substrate 10 is a representative example of a second substrate according to an embodiment of the present invention.

In describing the built-in electronic component substrate 1, for the sake of convenience, the term "one side" or the term "one surface" corresponds to a side or a surface that is positioned toward the below-described solder resist layer 13, and the term "other side" or the term "other surface" corresponds to a side or surface that is positioned toward the solder resist layer 37.

The substrate 10 includes an insulating layer 11, a wiring layer 12, a solder resist layer 13, a wiring layer 14, and a solder resist layer 15.

For example, a so-called epoxy glass substrate, which is a substrate having an insulating resin (e.g., epoxy type resin) impregnated in a glass cloth, may be used as the insulating layer 11. Alternatively, the insulating layer 11 may be a substrate having an insulating resin (e.g., epoxy type resin) impregnated in a woven or non-woven cloth made of glass fiber, carbon fiber, or an aramid fiber. The thickness of the insulating layer 11 may be, for example, approximately 60 μm to 200 μm. It is to be noted that the materials constituting the insulating layer 11 (e.g., glass cloth) are omitted from the accompanying drawings.

The wiring layer 12 is formed on one surface of the insulating layer 11. The wiring layer 12 is electrically connected to the wiring layer 14 interposed by the insulating layer 11. The insulating layer 11 has a via hole 11x penetrating therethrough and exposing one surface of the wiring layer 14. The wiring layer 12 includes a via wiring that fills the via hole 11x and a wiring pattern that is formed on one surface of the insulating layer 11.

The via hole 11x is open toward the solder resist layer 13 (opening part) and has a bottom surface formed by the upper surface of the wiring layer 14 (bottom part). The via hole 11x includes a recess part having a circular truncated cone shape in which the opening part of the via hole 11x has an area larger than the area of the bottom surface of the via hole 11x. The diameter of the opening part of the via hole 11x may be, for example, approximately 50 μm. For example, copper (Cu) may be used as the material of the wiring layer 12. The thickness of the wiring pattern constituting the wiring layer 12 may be, for example, approximately 10 μm to 20 μm.

The solder resist layer 13 is formed on the one surface of the insulating layer 11 and covers the wiring layer 12. The solder resist layer 13 may be formed of, for example, a photosensitive resin. The thickness of the solder resist layer 13 may be, for example, approximately 15 μm to 35 μm. The solder resist layer 13 includes an opening part 13x. A part of the wiring layer 12 is exposed in the opening part 13x. The part of the wiring layer 12 that is exposed in the opening part 13x constitutes a pad 12p. The pad 12p functions as a pad that is to be electrically connected to an electronic component such as a semiconductor chip (not illustrated).

Alternatively, the solder resist layer 13 may be formed exposing the entire pad 12p. In a case where the solder resist layer 13 is formed exposing the entire pad 12p, the solder resist layer 13 may be provided, so that a side surface of the pad 12p and a side surface of the solder resist layer 13 contact each other. Alternatively, in a case where the solder resist layer 13 is formed exposing the entire pad 12p, the solder resist layer 13 may be provided, so that a space is formed between the side surface of the pad 12p and the side surface of the solder resist layer 13.

According to necessity, a metal layer may be formed on the one surface of the pad 12p. Alternatively, an anti-oxidation process such as an OSP (Organic Solderability Preservative) process may be performed on the one surface of the pad 12p. The metal layer may be, for example, a gold layer (Au), a nickel/gold (Ni/Au) layer (i.e. metal layer including a Ni layer and a Au layer layered in this order), or a nickel/palladium/gold (Ni/Pd/Au) layer (i.e. metal layer including a Ni layer, a Pd layer, and a Au layer layered in this order). Further, an external connection terminal such as a solder ball may be formed on one surface of the pad 12p.

The wiring layer 14 is formed on the other surface of the insulating layer 11. One surface of the wiring layer 14 is electrically connected to the wiring layer 12 by contacting a lower end part of the via wiring filling the inside of the via hole 11x. For example, the material and the thickness of the wiring layer 14 may be the same as the material and the thickness of the wiring pattern constituting the wiring layer 12. It is to be noted that the wiring layer 14 is a representative example of a first wiring layer according to an embodiment of the present invention.

The solder resist layer 15 is formed on the other surface of the insulating layer 11 and covers the wiring layer 14. For example, the material and the thickness of the solder resist layer 15 may be the same as the material and the thickness of the solder resist layer 13. The solder resist layer 15 is formed including an opening part 15x and exposing a part of the wiring layer 14 in the opening part 15x. The part of the wiring layer 14 that is exposed in the opening part 15x constitutes a pad 14p. The pad 14p functions as a pad that is to be electrically connected to the substrate connection member 20.

Alternatively, the solder resist layer 15 may be formed exposing the entire pad 14p. In a case where the solder resist layer 15 is formed exposing the entire pad 14p, the solder resist layer 15 may be provided, so that a side surface of the pad 14p and a side surface of the solder resist layer 15 contact each other. Alternatively, in a case where the solder resist layer 15 is formed exposing the entire pad 14p, the solder resist layer 15 may be provided, so that a space is formed between the side surface of the pad 14p and the side surface of the solder resist layer 15. According to necessity, similar to the above-described metal layer formed on the one surface of the pad 12p, a metal layer may be formed on the other surface of the pad 14p. Alternatively, an anti-oxidation process such as an OSP (Organic Solderability Preservative) process may be performed on the other surface of the pad 14p.

The substrate 30 includes an insulating layer 31, a wiring layer 32, an insulating layer 33, a wiring layer 34, a solder resist layer 35, a wiring layer 36, and a solder resist layer 37.

For example, the material and the thickness of the insulating layer 31 may be the same as the material and the thickness of the insulating layer 11. The wiring layer 32 is formed on the one surface of the insulating layer 31. For example, the material and the thickness of the wiring layer 32 may be the same as the material and the thickness of the wiring pattern constituting the wiring layer 12.

The insulating layer 33 is formed on the one surface of the insulating layer 31 and covers the wiring layer 32. The material of the insulating layer 33 may be, for example, an insulating resin (e.g., epoxy type resin) having a thermosetting property. The insulating layer 33 may include a filler such as silica ($SiO_2$). The thickness of the insulating layer 33 may be, for example, approximately 15 μm to 35 μm.

The wiring layer 34 is farmed toward one side of the insulating layer 33. The insulating layer 33 includes a via hole 33x penetrating the insulating layer 33 and exposing one surface of the wiring layer 32. The wiring layer 34 includes a via wiring that fills the via hole 33x and a wiring pattern that is formed on one surface of the insulating layer 33.

The via hole 33x is open toward the solder resist layer 35 (opening part) and has a bottom surface formed by the one surface of the wiring layer 32 (bottom part). The via hole 33x includes a recess part having a circular truncated cone shape in which the opening part of the via hole 33x has an area larger than the area of the bottom surface of the via hole 33x. For example, the material of the wiring layer 34 and the thickness of wiring pattern constituting the wiring layer 34 may be the same as the material and the thickness of the wiring layer 12. It is to be noted that the wiring layer 34 is a representative example of a second wiring layer according to an embodiment of the present invention.

The solder resist layer 35 is formed on the one surface of the insulating layer 33 and covers the wiring layer 34. For example, the material and the thickness of the solder resist layer 35 may be the same as the material and the thickness of the solder resist layer 13. The solder resist layer 35 is formed including an opening part 35x and exposing a part of the wiring layer 34 in the opening part 35x. The part of the wiring layer 34 that is exposed in the opening part 35x constitutes a pad 34p.

A part of the pad 34p functions as a pad that is to be electrically connected to the substrate connection member 20. Another part of the pad 34p functions as a pad that is to be electrically connected to the semiconductor chip 50. It is to be noted that, an opening (e.g., opening part 35x) that exposes the pad 34p to be electrically connected to the substrate connection member 20 and an opening that exposes the pad 34p to be connected to the semiconductor chip 50 may be formed with diameters different from each other.

Alternatively, the solder resist layer 35 may be formed exposing the entire pad 34p. In a case where the solder resist layer 35 is formed exposing the entire pad 34p, the solder resist layer 35 may be provided, so that a side surface of the pad 34p and a side surface of the solder resist layer 35 contact each other. Alternatively, in a case where the solder resist layer 35 is formed exposing the entire pad 34p, the solder resist layer 35 may be provided, so that a space is formed between the side surface of the pad 34p and the side surface of the solder resist layer 35. According to necessity, similar to the above-described metal layer formed on the one surface of the pad 12p, a metal layer may be formed on the one surface of the pad 34p. Alternatively, an anti-oxidation process such as an OSP (Organic Solderability Preservative) process may be performed on the one surface of the pad 34p.

The wiring layer 36 is formed toward the other side of the insulating layer 31. The insulating layer 31 includes a via hole 31x penetrating the insulating layer 31 and exposing the other surface of the wiring layer 32. The wiring layer 36 includes a via wiring that fills the via hole 31x and a wiring pattern that is formed on the other surface of the insulating layer 31.

The via hole 31x is open toward the solder resist layer 37 (opening part) and has a bottom surface formed by the other surface of the wiring layer 32 (bottom part). The via hole 31x includes a recess part having a circular truncated cone shape in which the opening part of the via hole 31x has an area larger than the area of the bottom surface of the via hole 31x. The other surface of the wiring layer 32 is electrically connected to the wiring layer 36 by contacting an upper end part of the via wiring filling the inside of the via hole 31x. For example, the material and the thickness of the wiring layer 36 may be the same as the material and the thickness of the wiring pattern constituting the wiring layer 12.

The solder resist layer 37 is formed on the other surface of the insulating layer 31 and covers the wiring layer 36. For example, the material and the thickness of the solder resist layer 37 may be the same as the material and the thickness of the solder resist layer 13. The solder resist layer 37 includes an opening part 37x. A part of the wiring layer 36 is exposed in the opening part 37x. The part of the wiring layer 36 that is exposed in the opening part 37x constitutes a pad 36p. The pad 36p functions as a pad that is to be electrically connected to a mounting substrate such as a motherboard (not illustrated). An external connection terminal such as a solder ball may be formed on the other surface of the pad 36p.

Alternatively, the solder resist layer 37 may be formed exposing the entire pad 36p. In a case where the solder resist layer 37 is formed exposing the entire pad 36p, the solder resist layer 37 may be provided, so that a side surface of the pad 36p and a side surface of the solder resist layer 37 contact each other. Alternatively, in a case where the solder resist layer 37 is formed exposing the entire pad 36p, the solder resist layer 37 may be provided, so that a space is formed between the side surface of the pad 36p and the side surface of the solder resist layer 37. According to necessity, similar to the above-described metal layer formed on the one surface of the pad 12p, a metal layer may be formed on the other surface of the pad 36p. Alternatively, an anti-oxidation process such as an OSP (Organic Solderability Preservative) process may be performed on the other surface of the pad 36p.

The semiconductor chip 50 is mounted on the one surface of the substrate 30 in a face-down state by using a flip-chip method. That is, the semiconductor chip 50 is flip-chip bonded in a state where a circuit forming surface (surface of the semiconductor chip on which a circuit is formed) of the semiconductor chip 50 is faced toward the one surface of the substrate 30. More specifically, the semiconductor chip 50 includes a chip body 51 including a semiconductor integrated circuit and a protruding electrode 52 which is a connection terminal 52. The protruding electrode 52 of the semiconductor chip 50 is electrically connected to the pad 34p of the substrate 30 by way of the bonding part 41. For example, a metal bump or a metal post may be used as the protruding electrode 52. For example, a solder material formed of an alloy such as an alloy including lead (Pb), an alloy including tin (Sn) and copper (Cu), an alloy including tin (Sn) and lead (Sb), an alloy including tin (Sn) and silver (Ag), or an alloy including tin (Sn), silver (Ag), and copper (Cu) may be used as the bonding part 41.

It is, however, to be noted that the electronic component to be installed in the built-in electronic component substrate 1 is not limited to a semiconductor chip. For example, a passive device such as a capacitor, an inductor, or a resistor may be installed instead of the semiconductor chip 50. Alternatively, a so-called CSP (Chip Size Package) having wirings redistributed to a semiconductor chip may be installed in the built-in electronic component substrate 1. Alternatively, a combination including any of the above-described semiconductor device 50, the passive device, and the CSP may be installed in the built-in electronic component substrate 1. It is to be noted that the one surface of the substrate 30 may also be hereinafter referred to as an "facing surface of the substrate 30 with respect to the substrate 10 (i.e. surface of the substrate 30 that faces the substrate 10)" or a "second surface of the substrate 30".

The underfill resin 42 fills in between the circuit forming surface (surface on a side of the protruding electrode 52) of the semiconductor chip 50 and the one surface of the substrate 30 and extends to each side surface of the semiconductor chip 50. The back surface (surface opposite from the circuit forming surface) of the semiconductor chip 50 is exposed from the underfill resin 42.

In other words, the circuit forming surface and the side surfaces of the semiconductor chip 50 are continuously covered by the underfill resin 42. For example, an insulating resin (e.g., epoxy type resin) having a thermosetting property may be used as the material of the underfill resin 42. The underfill resin 42 may include a filler such as silica ($SiO_2$). It is to be noted that the underfill resin 42 is a representative example of a first resin according to an embodiment of the present invention.

The back surface of the semiconductor chip 50 and an end surface of the underfill resin 42 covering the side surface of the semiconductor chip 50 are substantially flush with each other. The end surface of the underfill resin 42 is a surface that contacts the resin film 55 and faces the substrate 10. The height of the back surface of the semiconductor chip 50 from the one surface of the substrate 30 and the height of the end surface of the underfill resin 42 from the one surface of the semiconductor chip 50 may be, for example, approximately 100 μm to 150 μm.

The resin film 55 fills in between the back surface of the semiconductor chip 50 and the other surface of the substrate 10 and between the end surfaces of the underfill resin 42 and the other surface of the substrate 10. It is to be noted that the other surface of the substrate 10 may also be hereinafter referred to as an "facing surface of the substrate 10 with respect to the substrate 30 (i.e. surface of the substrate 10 that faces the substrate 30)" or a "first surface of the substrate 10".

For example, an insulating resin film (e.g., epoxy type resin film) having a thermosetting property such as a NCF (Non Conductive Film) may be used as the resin film 55. The thickness of the resin film 55 (space between the back surface of the semiconductor chip 50 and the solder resist layer 15 of the substrate 10 and space between the end surfaces of the underfill resin 42 and the solder resist layer 15 of the substrate 10) may be, for example, approximately 5 μm to 25 μm. The resin film 55 may include a filler such as silica ($SiO_2$).

The material of the resin film 55 may be the same or different as the material of the underfill resin 42. In a case where the built-in electronic component substrate 1 tends to warp toward a certain direction, the warping can be reduced by adjusting the materials of the underfill resin 42 and the resin film 55. For example, warping of the built-in electronic component substrate 1 can be reduced by adjusting the thermal expansion coefficient of each of the underfill resin 42 and the resin film 55. The thermal expansion coefficient of each of the underfill resin 42 and the resin film 55 may be adjusted, for example, by changing the amount or the material of the filler included in each of the underfill resin 42 and the resin film 55. It is to be noted that the resin film 55 is a representative example of a second resin according to an embodiment of the present invention.

In the embodiment illustrated in FIG. 1, an outer edge part of the resin film 55 protrudes from the underfill resin 42 from a plan view. However, the resin film 55 may be formed to exactly superpose the underfill resin 42 from a plan view. Alternatively, the resin film 55 may be formed in a small size, so that outer edge parts of the end surfaces of the underfill resin 42 are exposed. In this case, the molding resin 60 covers the parts of the end surfaces of the underfill resin 42 that are not covered by the resin film 55.

However, the space between the back surface of the semiconductor chip 50 and the other surface of the substrate 10 and the space between the end surfaces of the underfill resin 42 and the other surface of the substrate 10 are only approximately 5 μm to 25 μm. Therefore, if the part of the underfill resin 42 that is not covered by the resin film 55 is large, it may be difficult to fill the part of the underfill resin 42 with the molding resin 60. Thereby, voids may be generated in the part of the underfill resin 42 that is not covered by the resin film 55. Therefore, the part of the underfill resin 42 that is not covered by the resin film 55 is preferred to be approximately less than or equal to 50 μm from the side surface of the resin film 42 from a plan view.

The substrate connection member 20 is arranged between the pad 14p of the substrate 10 and the pad 34p of the substrate 30. The substrate connection member 20 functions to ensure electrical connection between the substrate 10 and the substrate 30 and to ensure a predetermined space between the substrate 10 and the substrate 30.

In this embodiment, a solder ball including a core may be used as the substrate connection member 20. The substrate connection member 20 includes a substantially spherical core 21 and a conductive material 22 covering an outer peripheral surface of the core 21. The core 21 is arranged to contact the pad (second pad) 14p and the pad (first pad) 34p.

For example, a metal core formed of metal (e.g., copper) or a resin core formed of resin may be used as the core 21. The material of the conductive material 22 may be, for example, an alloy including lead (Pb), an alloy including tin (Sn) and copper (Cu), an alloy including tin (Sn) and antimony (Sb), an alloy including tin (Sn) and silver (Ag), or an alloy including tin (Sn), silver (Ag), and copper (Cu). The diameter of the core 21 may be determined considering the height (thickness) of the semiconductor chip 50 and the height (thickness) of the resin film 55.

It is to be noted that the substrate connection member 20 is not limited to the solder ball including the core 21 and the conductive material 22 covering the outer peripheral surface of the core 21. For example, a solder ball having no core may be used as the substrate connection member 20. Alternatively, a metal post (e.g., copper post) or a metal bump (e.g., gold bump) may be used as the substrate connection member 20. In manufacturing the built-in electronic component substrate 1 where a solder ball having no core is used as the substrate connection member 20, the space between the substrate 10 and the substrate 30 may be controlled by using a given jig.

It is to be noted that the substrate connection member 20 illustrated in FIG. 1 is simplified. In reality, multiple rows of substrate connection members 20 may be arranged along a periphery of the built-in electronic component substrate 1. In a case where the substrates 10, 30 have rectangular shapes from a plan view, multiple substrate connection members 20 may be arranged in the peripheries of the substrates 10, 30. For example, in a case where the diameter of a single substrate connection member 20 is approximately 150 μm, the pitch between the multiple substrate connection members 20 may be approximately 200 μm.

The molding resin 60 is supplied to fill in between the surfaces of the substrates 10, 30 facing each other, so that the substrate connection member 20, the semiconductor chip 50, the underfill resin 42, and the resin film 55 are encapsulated therein. For example, an insulating resin (e.g., epoxy type resin) having a thermosetting property and including a filler may be used as the molding resin 60. It is to be noted that the molding resin 60 is a representative example of a third resin according to an embodiment of the present invention.

<Method for Manufacturing Wiring Substrate According to an Embodiment of the Present Invention>

Next, a method for manufacturing a wiring substrate according to the first embodiment of the present invention is described. FIGS. 2A to 4C are schematic diagrams illustrating processes for manufacturing the wiring substrate according to the first embodiment of the present invention.

Figure 2A:
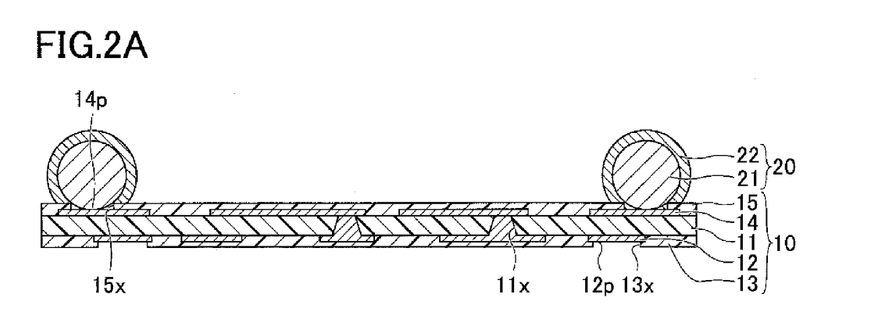
FIG. 2A-2D are schematic diagrams illustrating processes for manufacturing the built-in electronic component substrate according to the first embodiment of the present invention (part 1)

First, in the process illustrated in FIG. 2A, the substrate 10 is manufactured, and the substrate connection members 20 are mounted on the pads 14p of the substrate 10. More specifically, the insulating layer 11 is prepared by using, for example, the above-described epoxy glass substrate. Then, the wiring layer 14 is formed on the other surface of the insulating layer 11. Then, via holes 11x that expose the one surface of the wiring layer 14 are formed in the insulating layer 11. Then, the wiring layer 12 is formed on the one surface of the insulating layer 11. The wiring layer 12 and the wiring layer 14 are electrically connected interposed by the insulating layer 11.

After forming the via holes 11x, it is preferable to perform a desmearing process for removing residual resin adhered to the surface of the wiring layer 14 exposed at the bottom part of the via holes 11x. The via holes 11x may be formed by a laser processing method using, for example, a $CO_2$ laser. The wiring layers 12, 14 may be formed by using a semi-additive method or a subtractive method. For example, the wiring layers 12, 14 may be formed with copper plating.

Then, the solder resist layer 13 that covers the wiring layer 12 is formed on the one surface of the insulating layer 11, and the solder resist layer 15 that covers the wiring layer 14 is formed on the other surface of the insulating layer 11. The solder resist layer 13 may be formed on the one surface of the insulating layer 11 and cover the wiring layer 12 by applying a liquid or paste-like photosensitive epoxy type insulating resin on the one surface of the insulating layer 11. The liquid or paste-like photosensitive epoxy type insulating resin may be applied by using, for example, a screen printing method, a roll coating method, or a spin coating method.

Similarly, the solder resist layer 15 may be formed on the other surface of the insulating layer 11 and cover the wiring layer 14 by applying a liquid or paste-like photosensitive epoxy type insulating resin on the other surface of the insulating layer 11. Alternatively, instead of applying the liquid or paste-like photosensitive epoxy type insulating resin, the solder resist layers 13, 15 may be formed by laminating a film-like photosensitive epoxy type insulating resin.

Then, the opening parts 13x, 15x are formed on the solder resist layers 13, 15 by exposing and developing the applied or laminated insulating resin (photolithographic method). Thereby, the manufacturing of the substrate 10 is completed. It is to be noted that the opening parts 13x, 15x may be formed by a laser processing method or a blasting method. The plan-view shape of each of the opening parts 13x, 15x may be, for example, a circular shape. The diameter of each of the opening parts 13x, 15x may be arbitrarily set in correspondence with an object to be connected thereto.

Then, the substrate connection members 20 are placed on the pads 14p exposed in the opening parts 15x of the solder resist layer 15 of the substrate 10. Then, the substrate connection members 20 are heated to a predetermined temperature to melt the conductive materials 22 constituting the substrate connection members 20 and cure the molten conductive materials 22, so that the conductive materials 22 are bonded to the pads 14p. A part of the core 21 of the substrate connection member 20 contacts the pad 14p. It is to be noted that the substrate connection members 20 are arranged in the periphery of the substrate 10.

Figure 2B:
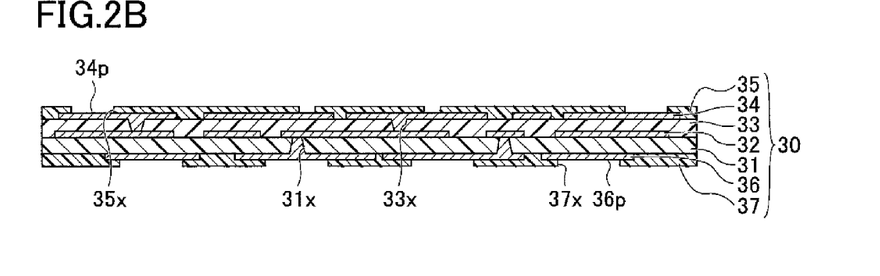

Then, in the process illustrated in FIG. 2B, the substrate 30 is manufactured. More specifically, the insulating layer 31 is prepared by using, for example, the above-described epoxy glass substrate. Then, the wiring layer 32 is formed on the one surface of the insulating layer 31. Then, via holes 31x that expose the other surface of the wiring layer 32 are formed in the insulating layer 31. Then, the wiring layer 36 is formed on the other surface of the insulating layer 31. The wiring layer 32 and the wiring layer 36 are electrically connected interposed by the insulating layer 31.

After forming the via holes 31x, it is preferable to perform a desmearing process for removing residual resin adhered to the surface of the wiring layer 32 exposed at the bottom part of the via holes 31x. The via holes 31x may be formed by a laser processing method using, for example, a $CO_2$ laser. The wiring layers 32, 36 may be formed by using a semi-additive method or a subtractive method.

Then, the insulating layer 33 may be formed on the one surface of the insulating layer 31 and cover the wiring layer 32 by laminating an insulating resin (e.g., epoxy type resin) film having a thermosetting property on the one surface of the insulating layer 31. Alternatively, instead of laminating the insulating resin (e.g., epoxy type resin) film having a thermosetting property, the insulating layer 33 may be formed by applying a liquid or paste-like photosensitive epoxy type insulating resin having a thermosetting property on the one surface of the insulating layer 31 and curing the applied liquid or paste-like photosensitive epoxy type insulating resin.

Then, the via holes 33x, which penetrate the insulating layer 33 and expose the one surface of the wiring layer 32, are formed in the insulating layer 33. The via holes 33x may be formed by using, for example, a laser process method (e.g., $CO_2$ laser). After forming the via holes 33x, it is preferable to perform a desmearing process for removing residual resin adhered to the surfaces of the wiring layer 32 exposed at the bottom parts of the via holes 33x.

Then, the wiring layer 34 is formed on the one side of the insulating layer 33. The wiring layer 34 is constituted by a via wiring filling the inside of the via holes 33x and a wiring pattern formed on the one surface of the insulating layer 33. The wiring layer 34 is electrically connected to the wiring layer 32 exposed at the bottom parts of the via holes 33x. The wiring layer 34 may be formed by using various wiring farming methods such as a semi-additive method or a subtractive method.

Then, similar to the process of forming the solder resist layer 13 of the substrate 10, the solder resist layer 35 that covers the wiring layer 34 is formed on the one surface of the insulating layer 33. Likewise, the solder resist layer 37 that covers the wiring layer 36 is formed on the other surface of the insulating layer 31. Then, similar to the process of forming the opening parts 13x of the substrate 10, the opening parts 35x, 37x are formed in the solder resist layers 35, 37, and the pads 34p, 36p are formed (photolithographic method). Thereby, the manufacturing of the substrate 30 is completed.

Figure 2C:
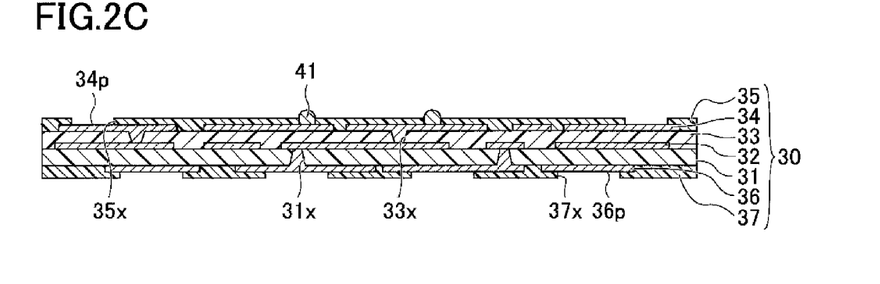

Then, in the process illustrated in FIG. 2C, the bonding parts 41 are formed in one or more of the pads 34p of the substrate 30 that are to be connected to the semiconductor chip 50. The bonding parts 41 may be formed by applying a paste-like solder material to the pads 34p and performing reflow on the applied solder material.

Figure 2D:
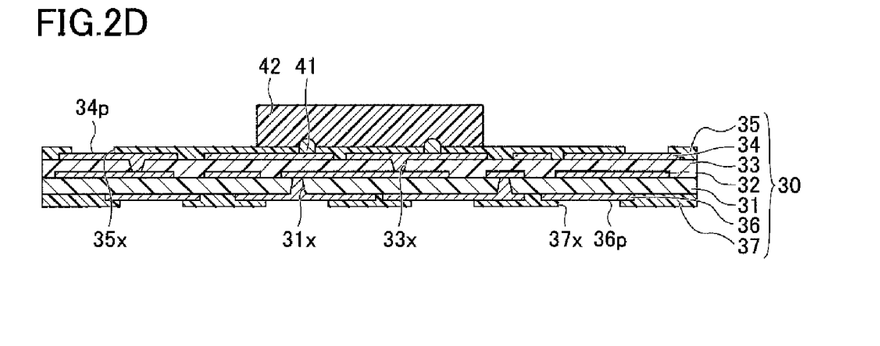

Then, in the process illustrated in FIG. 2D, the underfill resin 42 is adhered (laminated) to the one surface of the substrate 30 to cover the bonding parts 41. For example, an insulating resin film (e.g., epoxy type resin film) having a thermosetting property may be used as the underfill resin 42. At the time of adhering the underfill resin 42, the underfill resin 42 is in a B-stage state (semi-cured state). It is to be noted that the underfill resin 42 is adhered to the one surface of the substrate 30 (surface of the solder resist layer 35) to expose the one surface of the substrate 42 except for an area on which an electronic component (e.g., semiconductor chip 50) is to be mounted.

Figure 3A:
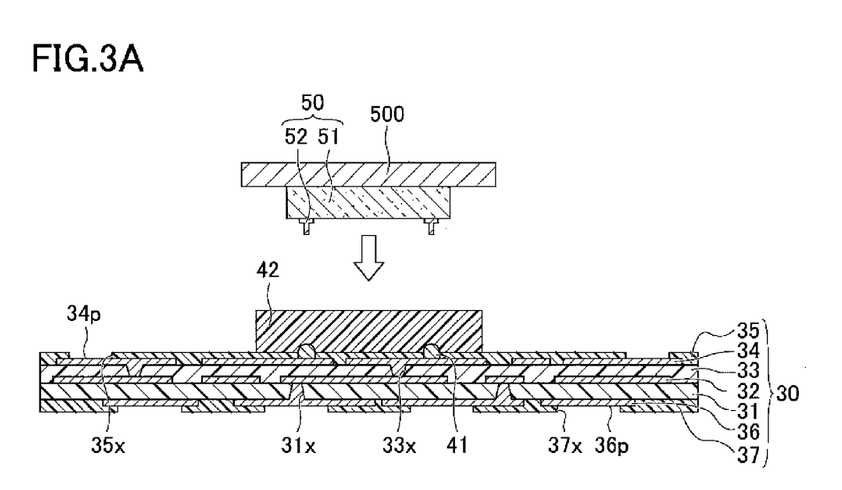
FIG. 3A-3C are schematic diagrams illustrating processes for manufacturing the built-in electronic component substrate according to the first embodiment of the present invention (part 2)

Then, in the process illustrated in FIG. 3A, the semiconductor chip 50 is prepared. The semiconductor chip 50 includes the chip body 51 having a semiconductor integrated circuit and the protruding electrode 52 formed on the circuit forming surface of the chip body 51. Then, the back surface of the semiconductor chip 50 is mounted on a lower surface of a pickup jig 500. Then, the pickup jig 500, which has the semiconductor chip 50 mounted on its lower surface, is moved to an area above the underfill resin 42 and positioned to have a side of the protruding electrode 52 of the semiconductor chip 50 facing the upper surface of the underfill resin 42.

Figure 3B:
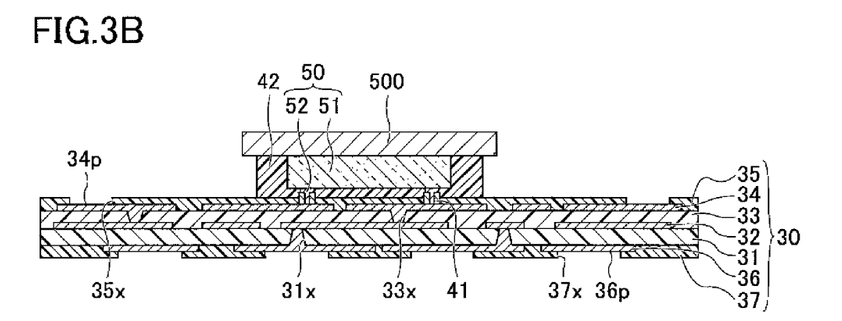

Then, in the process illustrated in FIG. 3B, the bonding parts 41 and the underfill resin 42 are heated to a predetermined temperature. Then, in a state where the bonding parts 41 and the underfill resin 42 are heated, the pickup jig 500 having the semiconductor chip 50 mounted on its lower surface is pressed into the underfill resin 42 from the area above the underfill resin 42. The semiconductor chip 50 is pressed into the underfill resin 42 until a distal end part of the protruding electrode 52 contacts the one surface of the pad 34p by way of the bonding parts 41 made molten by the heat. By applying pressure from the surface of the pickup jig 500 to the surface of the underfill resin 42, so that the semiconductor chip 50 is pressed into the underfill resin 42, the back surface of the semiconductor chip 50 and the end surface of the underfill resin 42 become substantially flush with each other.

Figure 3C:
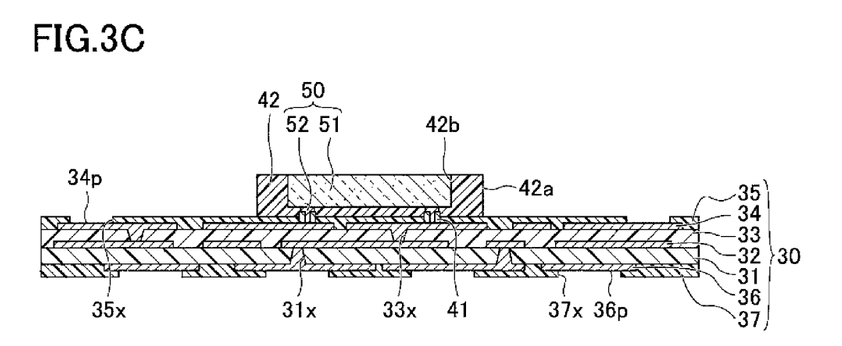

Then, in the process illustrated in FIG. 3C, the pickup jig 500 is removed from the semiconductor chip 50 after the bonding parts 41 and the underfill resin 42 are cured. Thereby, the protruding electrode 52 of the semiconductor chip 50 is electrically connected to the pad 34p of the substrate 30 interposed by the bonding parts 41.

Further, the underfill resin 42 is filled in between the circuit forming surface (surface toward the protruding electrode 52) of the semiconductor chip 50 and the one surface of the substrate 30 and also extends to each side surface of the semiconductor chip 50. In other words, the underfill resin 42 is formed to expose the back surface of the semiconductor chip 50 and cover the circuit forming surface and the side surfaces of the semiconductor chip 50.

Thereby, the back surface of the semiconductor chip 50 and the end surfaces of the underfill resin 42 covering the sides surfaces of the semiconductor chip 50 become substantially flush with each other. The height of the back surface of the semiconductor chip 50 from the one surface of the substrate 30 and the height of the end surface of the underfill resin 42 from the one surface of the semiconductor chip 50 may be, for example, approximately 100 μm to 150 μm. A side part of the underfill resin 42 that covers a corresponding side surface of the semiconductor chip 50 may have a width of approximately 50 μm to 1000 μm. That is, a length between an outer side surface 42a of the underfill resin 42 and an inner side surface 42b of the underfill resin 42 may be approximately 50 μm to 1000 μm.

Figure 4A:
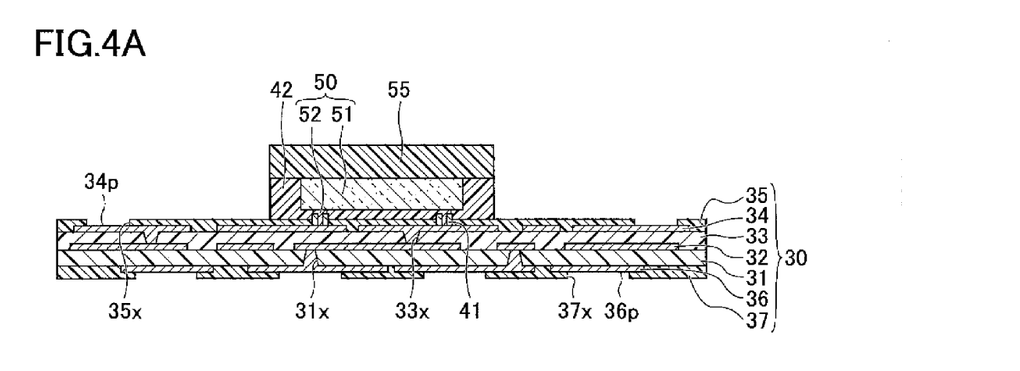
FIG. 4A-4C are schematic diagrams illustrating processes for manufacturing the built-in electronic component substrate according to the first embodiment of the present invention (part 3)

Then, in the process illustrated in FIG. 4A, the resin film 55 is adhered (laminated) on the back surface of the semiconductor chip 50 and the end surfaces of the underfill resin 42 to continuously cover the back surface of the semiconductor chip 50 and the end surfaces of the underfill resin 42. For example, an insulating resin (e.g., epoxy type resin) film having a thermosetting property may be used as the resin film 55. The thickness of the resin film 55 may be, for example, approximately 15 μm to 30 μm. At the time of adhering the resin film 55, the resin film 55 is in a B-stage state.

It is to be noted that the resin film 55 slightly spreads in a horizontal direction by being pressed during a below-described process. Therefore, taking the spreading of the resin film 55 into consideration, a film having a plan-view area smaller than the back surface of the semiconductor chip 50 and the end surface of the underfill resin 42 may be adhered as the resin film 55.

Figure 4B:
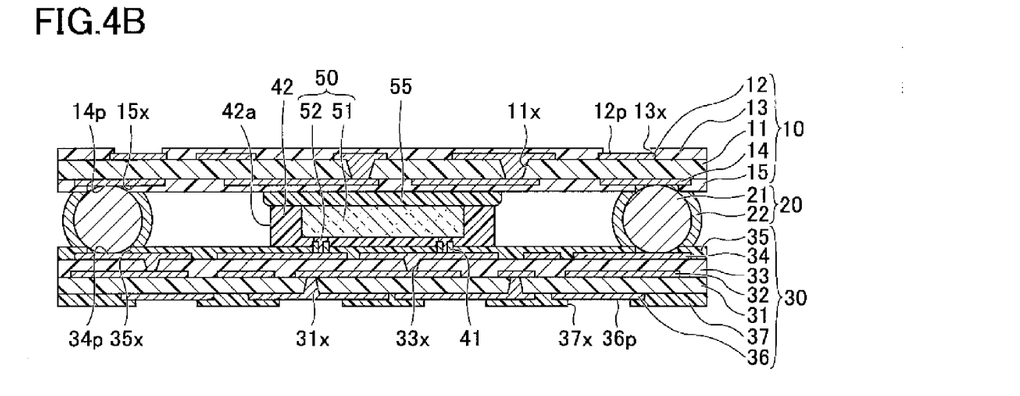

Then, in the process illustrated in FIG. 4B, the substrate 10 having the substrate connection members 20 of FIG. 2A mounted thereon is prepared. Then, the substrate 10 is layered on the substrate 30, so that the solder resist layer 15 of the substrate 10 contacts the resin film 55 while the conductive members 22 of the substrate bonding materials of the substrate 10 contact the one surface of the pads 34p. In other words, the substrate 10 is layered on the substrate 30 in a state where the semiconductor chip 50, the underfill resin 42, and the substrate connection member 20 are faced inward of the built-in electronic component substrate 1. Then, the substrate 10 is pressed toward the substrate 30 while heating the conductive members 22 and the resin film 55. Thereby, an upper side of the core 21 of the substrate connection member 20 contacts the pad 14P of the substrate 10, and a lower side of the core 21 of the substrate connection member 20 contacts the pad 34p of the substrate 30. Thereby, the substrate 10 and the substrate 30 are electrically connected interposed by the substrate connection members 20. Further, the cores 21 of the substrate connection members 20 ensure a space between the substrate 10 and the substrate 30.

Further, the resin film 55 becomes thinner as the resin film 55 is pressed toward the substrate 30. Accordingly, the one surface of the resin film 55 closely contacts the solder resist layer 15 of the substrate 10 whereas the other surface of the resin film 55 closely contacts the back surface of the semiconductor chip 50 and the end surfaces of the underfill resin 42. Thus, the one surface of the resin film 55 adheres to the solder resist layer 15 whereas the other surface of the resin film 55 adheres to the back surface of the semiconductor chip 50 and the end surfaces of the underfill resin 42. In other words, the resin film 55 fills in between the back surface of the semiconductor chip 50 and the other surface of the substrate 10 and between the end surfaces of the underfill resin 42 and the other surface of the substrate 10. For example, the thickness of the resin film 55 before being pressed toward the substrate 30 is approximately 15μ to 30 μm whereas the thickness of the resin film 55 after being pressed toward the substrate 30 is approximately 5 μm to 25 μm. An amount (length) in which the resin film 55 protrudes with respect to the outer side surface 42a of the underfill resin 42 may be approximately 50 μm to 800 μm.

It is to be noted that the resin film 55 is adhered to the other surface of the substrate 10 (surface of the solder resist layer 15) to expose the other surface of the substrate 10 except for an area on which an electronic component (e.g., semiconductor chip 50) is mounted.

Figure 4C:
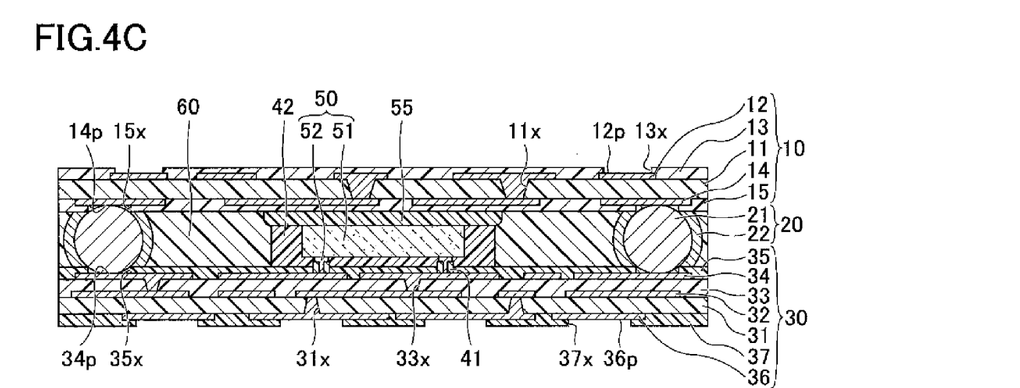

Then, in the process illustrated in FIG. 4C, after the conductive members 22 and the resin film 55 are cured, the molding resin 60 is supplied to fill in between the substrates 10, 30, so that the substrate connection member 20, the semiconductor chip 50, the underfill resin 42, and the resin film 55 are encapsulated therein. For example, an insulating resin (e.g., epoxy type resin) having a thermosetting property and including a filler may be used as the molding resin 60. The molding resin 60 may be formed by, for example, a transfer molding method using a metal die.

It is to be noted that, in a case where flux is adhered to, for example, the surface of the substrate 10 or the substrate 30 after the process illustrated in FIG. 4B, it is preferred to proceed to the process of FIG. 4C after a process of cleaning the flux is performed. In this embodiment, the resin film 55 fills in between the back surface of the semiconductor chip 50 and the other surface of the substrate 10 and between the end surfaces of the underfill resin 42 and the other surface of the substrate 10. Therefore, unlike the related art, there is no need to clean the flux in the narrow area between the back surface of the semiconductor chip 50 and the other surface of the substrate 10 facing the back surface of the semiconductor chip 50. Accordingly, the flux cleaning process can be facilitated.

Hence, with the first embodiment of the present invention, the substrate connection member 20, the semiconductor chip 50, the underfill resin 42, and the resin film 55 are encapsulated by the molding resin 60 after the resin film 55 fills in between the back surface of the semiconductor chip 50 and the other surface of the substrate 10 and between the end surfaces of the underfill resin 42 and the other surface of the substrate 10. Thus, because there is no space between the back surface of the semiconductor chip 50 and the substrate 10 facing the back surface of the semiconductor chip 50 with the first embodiment of the present invention, there is no need to consider filling such space as the related art example.

In other words, with the related art example, it is necessary to consider the height of the semiconductor chip and the fillability with resin for ensuring a sufficient space between the back surface of the semiconductor chip and the substrate facing the back surface of the semiconductor chip. Thus, the height of the semiconductor chip and the fillability with the resin are to be taken into consideration for determining the size of the substrate connection member according to the related art example. On the other hand, the size of the substrate connection member 20 according to the embodiment of the present invention can be determined without considering the fillability with resin and need only to take the height of the semiconductor chip 50 and the height of the resin film 55 into consideration.

In determining the size of the substrate connection member 20, the resin film 55 can be formed with a less thickness (approximately 5 μm to 25 μm) compared to a space (equal to or greater than 40 μm) provided between the back surface of the semiconductor chip and the substrate facing the back surface of the semiconductor chip of the related art example for ensuring fillability with resin. Therefore, the diameter of the substrate connection member 20 can be reduced compared to the diameter of the substrate connection member of the related art example. As a result, the thickness of the built-in electronic component substrate 1 can be reduced.

It is to be noted that, with the above-described embodiment of the present invention, the underfill resin 42 covers the side surfaces of the semiconductor chip 50. Thus, in order to prevent a narrow space from being formed between the end surfaces of the underfill resin 42 and the other surface of the substrate 10, the resin film 55 is also formed between the end surfaces of the underfill resin 42 and the other surface of the substrate 10.

First Modified Example of First Embodiment

With a first modified example of the first embodiment, a built-in electronic component substrate can be formed with a thickness less than that of the built-in electronic component substrate 1 of the first embodiment. In the first modified example, like components are denoted with like reference numerals as the reference numerals of the first embodiment and are not further explained.

Figure 5:
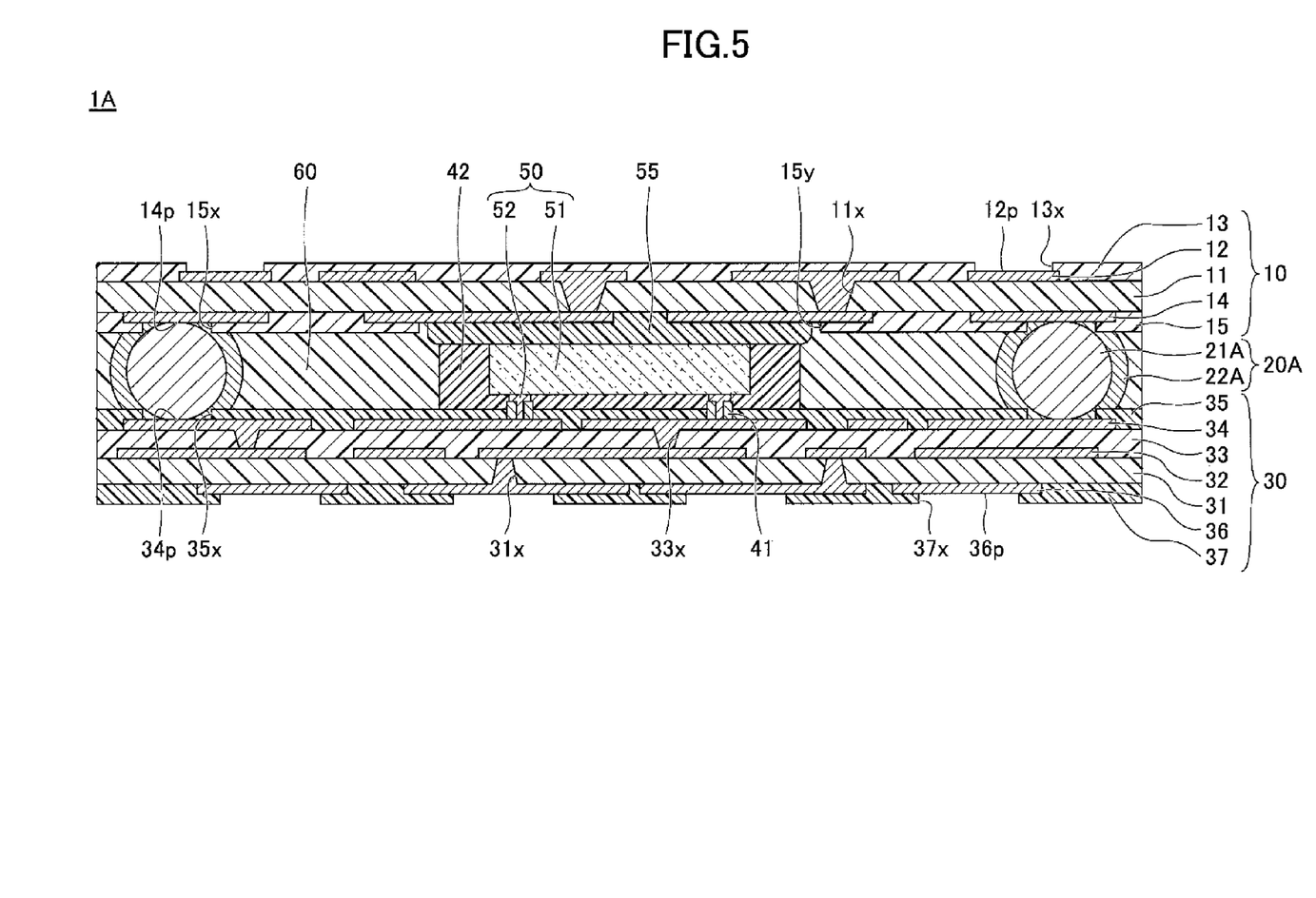
FIG. 5 is a cross-sectional view illustrating a built-in electronic component substrate according to a first modified example of the first embodiment.

FIG. 5 is a cross-sectional view illustrating a built-in electronic component substrate 1A according to the first modified example. With reference to FIG. 5, the built-in electronic component substrate 1A is different from the built-in electronic component substrate 1 of the first embodiment (see FIG. 1) in that an opening part 15y is formed in the solder resist layer 15, and the substrate connection components 20 are replaced with substrate connection components 20A.

As illustrated in FIG. 5, the opening part 15y, which is a cavity for providing the resin film 55 therein, is formed in the solder resist layer 15. The opening part 15y may have, for example, a rectangular shape from a plan view.

The substrate connection member 20A includes a substantially spherical-shaped core 21A and a conductive material 22A surrounding an outer peripheral surface of the core 21A. The substrate connection member 20A is positioned, so that the core 21A contacts the pad 14p and the pad 34p. The substrate connection member 20A (core 21A) has a diameter smaller than the diameter of the substrate connection member 20 (core 21). The material of the core 21A and the conductive material 22A may be, for example, the same material as the core 21 and the conductive material 22.

By providing the opening part 15y in the solder resist layer 15 and providing the resin film 55 in the opening part 15y, the space at the area connecting the substrate 10 and the substrate 30 can be narrowed. Therefore, the substrate connection member 20A having a smaller diameter than the substrate connection member 20 (core member 21A having a smaller diameter than the core member 21A) can be used. As a result, the built-in electronic component substrate 1A can be formed with a thickness less than the thickness of the built-in electronic component substrate 1.

Further, because the substrate connection member 20A having a smaller diameter than the substrate connection member 20 (core member 21A having a smaller diameter than the core member 21A) can be formed, the pitch between the substrate connection members 20A of the built-in electronic component substrate 1A can be narrower than the pitch between the substrate connection members 20 of the built-in electronic component substrate 1. As a result of narrowing the pitch between the substrate connection members 20A, the size of the built-in electronic component substrate 1A from a plan view can be reduced.

Second Modified Example of First Embodiment

With a second modified example of the first embodiment, a substrate connection member can be formed with a smaller diameter than a diameter of the substrate connection member 20 of the first embodiment without changing the thickness of the built-in electronic component substrate 1 of the first embodiment. In the second modified example, like components are denoted with like reference numerals as the reference numerals of the first embodiment and are not further explained.

Figure 6:
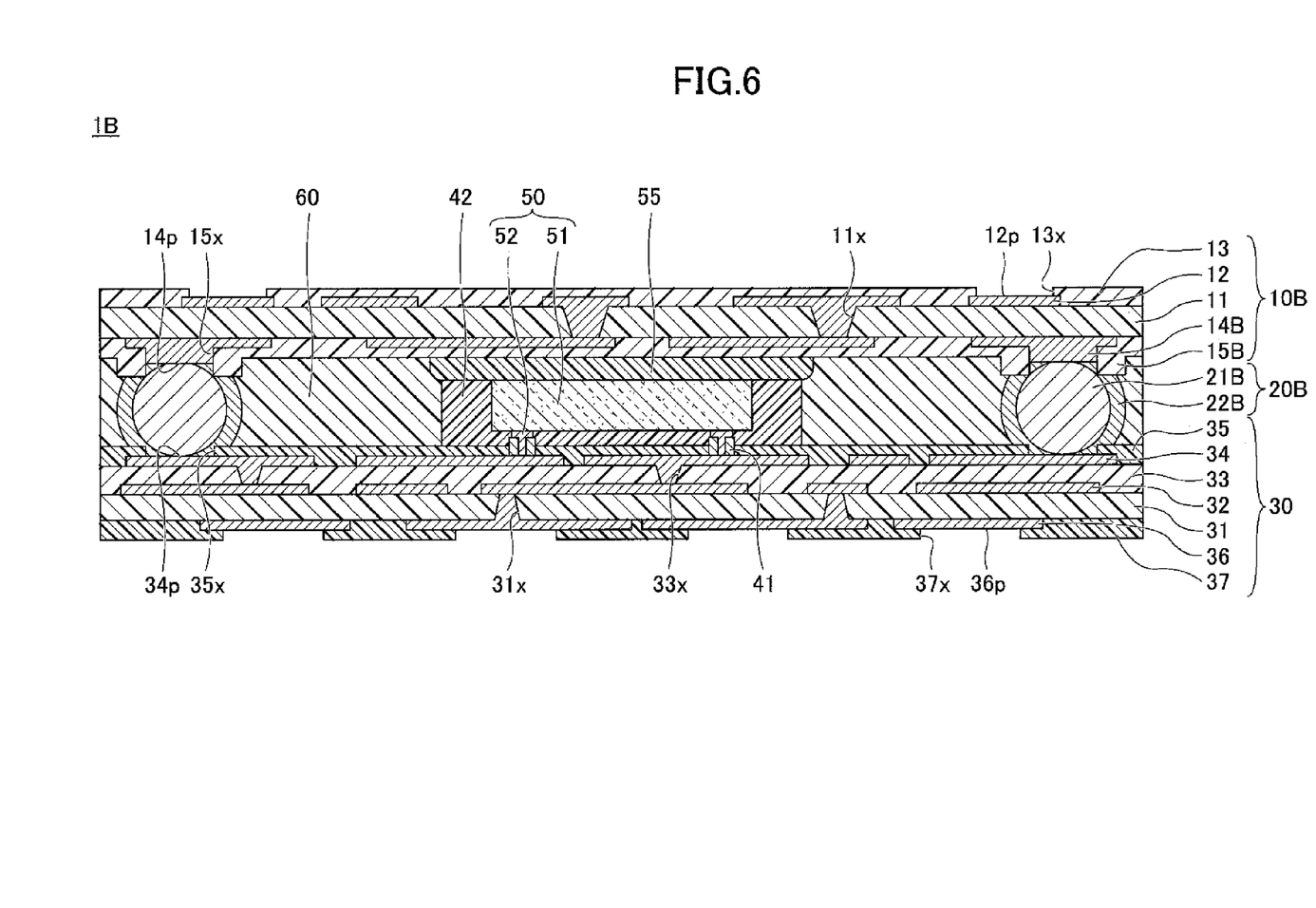
FIG. 6 is a cross-sectional view illustrating a built-in electronic component substrate according to a second modified example of the first embodiment.

FIG. 6 is a cross-sectional view illustrating a built-in electronic component substrate 15 according to the second modified example. With reference to FIG. 6, the built-in electronic component substrate 1B is different from the built-in electronic component substrate 1 of the first embodiment (see FIG. 1) in that the substrate 10 is replaced with a substrate 103, and the substrate connection components 20 are replaced with substrate connection components 20B.

As illustrated in FIG. 6, the substrate 10B includes a height increasing part 14B formed in the wiring layer 14. The height increasing part 14B has a conductive property and protrudes toward the substrate 30. The height increasing part 14B is a part of the wiring layer 14 that contacts a core 21B of the substrate connection member 20B. The height increasing part 14B may be formed by, for example, masking a predetermined part of the wiring layer 14 after the wiring layer 14 is formed and performing a copper plating process on an area (exposed area) of the wiring layer 14 that is not masked.

Further, an opening part 15x is formed in the solder resist layer 15. Further, a height increasing part 15B having an insulating property is formed in a periphery of the opening part 15x. The height increasing part 15B may be formed to protrude at an outer peripheral side of the height increasing part 14B. That is, a surface of the height increasing part 14B is provided in a recessed position relative to a surface of the height increasing part 15B. Owing to the shape of the height increasing part 15B, the positioning of the substrate connection member 20B can be facilitated. The height increasing part 15B may be formed by, for example, masking a predetermined part of the solder resist layer 15 after the solder resist layer 15 is formed, applying a resin on an area (exposed area) of the solder resist layer 15 that is not masked, and curing the applied resin.

The substrate connection member 20B includes a substantially spherical-shaped core 21B and a conductive material 22B surrounding an outer peripheral surface of the core 21B. The substrate connection member 20B is positioned, so that the core 21B contacts the pad 14p of the height increasing part 14B exposed from the opening part 15x and the pad 34p exposed from the opening part 35x. The substrate connection member 20B (core 21B) has a diameter smaller than the diameter of the substrate connection member 20 (core 21). The material of the core 21B and the conductive material 222 may be, for example, the same material as the core 21 and the conductive material 22. It is to be noted that the thickness of the built-in electronic component substrate 1B is the same as the thickness of the built-in electronic component 1.

Accordingly, by forming the height increasing part 14B in the wiring layer 14, the space in which the substrate 10B and the substrate 30 are connected can be narrowed even in a case where the thickness of the built-in electronic component substrate 1B is the same as the thickness of the built-in electronic component substrate 1. Therefore, the substrate connection member 203 having a smaller diameter than the substrate connection member (core member 21B having a smaller diameter than the core member 21) can be used.

Further, because the substrate connection member 202 having a smaller diameter than the substrate connection member 20 (core member 21B having a smaller diameter than the core member 21) can be formed, the pitch between the substrate connection members 20B of the built-in electronic component substrate 1B can be narrower than the pitch between the substrate connection members 20 of built-in electronic component substrate 1. As a result, the planar size of the built-in electronic component substrate 1B can be reduced compared to the planar size of the built-in electronic component substrate 1.

Applied Example of the First Embodiment

With an applied example of the first embodiment, a semiconductor package is mounted on one surface of the built-in electronic component substrate 1 of the first embodiment. In the applied example, like components are denoted with like reference numerals as the reference numerals of the first embodiment and are not further explained.

Figure 7:
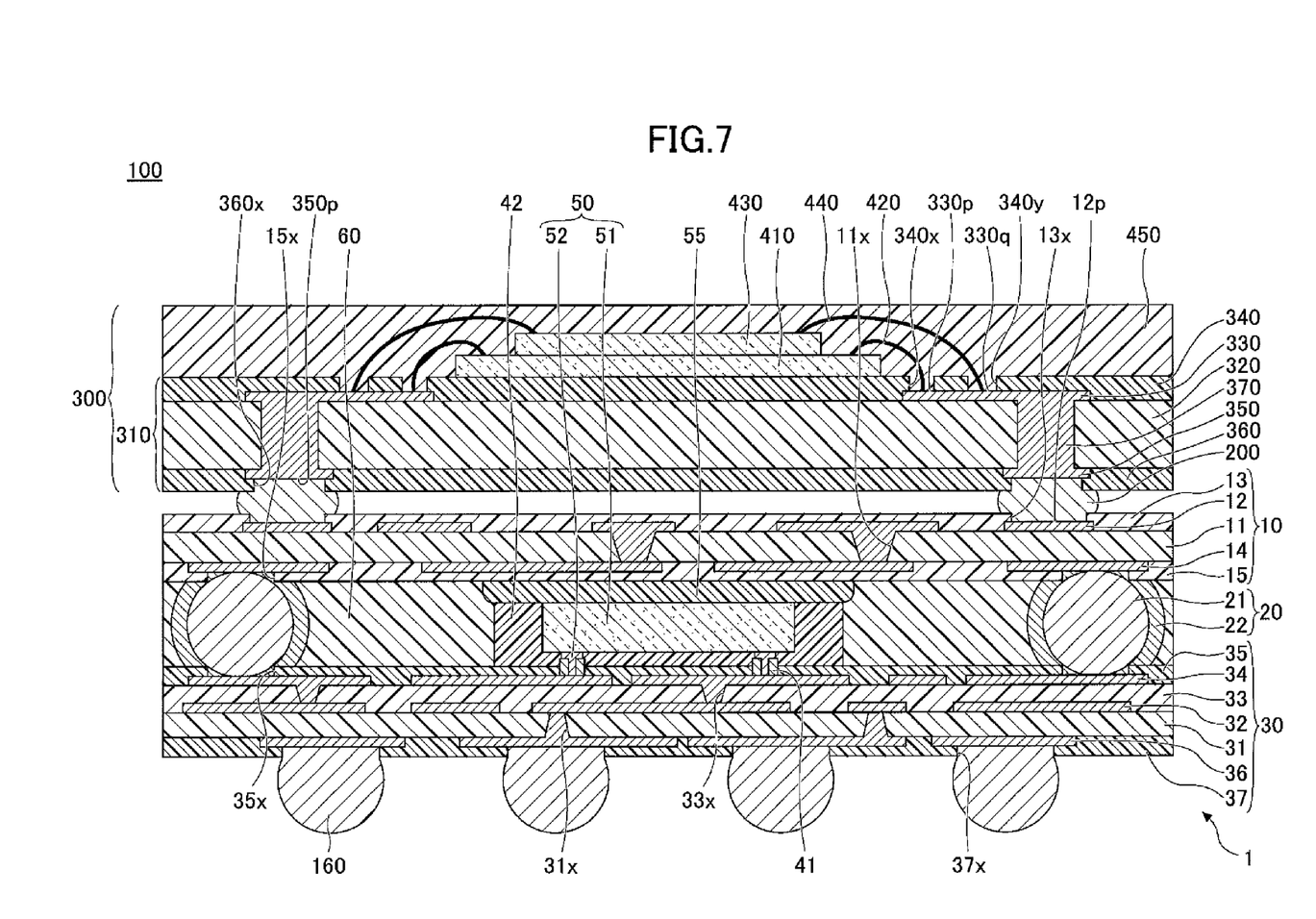
FIG. 7 is a cross-sectional view illustrating an example of applying a built-in electronic component substrate of the first embodiment.

FIG. 7 is a cross-sectional view illustrating an example of applying the built-in electronic component substrate 1 of the first embodiment. With reference to FIG. 7, the built-in electronic component substrate 1 of the first embodiment is applied to a semiconductor package 100. The semiconductor package 100 has a structure in which a semiconductor package 300 is mounted on the built-in electronic component substrate 1 interposed by an external connection terminal 200. Further, an external connection terminal 160 such as a solder ball is provided on the pad 36p of the built-in electronic component substrate 1. The semiconductor package 300 mainly includes a wiring substrate 310, a semiconductor chip 410, a semiconductor chip 430, and an encapsulating resin 450.

The wiring substrate 310 includes an insulating layer 320, a wiring layer 330 formed on one surface of the insulating layer 320, and a solder resist layer 340 that is formed on the one surface of the insulating layer 320 to cover the wiring layer 330. Further, the wiring substrate 310 includes a wiring layer 350 formed on the other surface of the insulating layer 320, a solder resist layer 360 formed on the other surface of the insulating layer 320 to cover the wiring layer 350, and a through-electrode 370 connecting the wiring layer 330 and the wiring layer 350. The through-electrode 370 is provided in a through-hole penetrating the insulating layer 320.

The solder resist layer 340 includes opening parts 340x, 340y. Parts of the wiring layer 330 are exposed in the opening parts 340x, 340y. The part of the wiring layer 330 exposed in the opening part 340x constitutes a pad 330p. The part of the wiring layer 330 exposed in the opening part 340y constitutes a pad 330q. The solder resist layer 360 includes an opening part 360x. A part of the wiring layer 350 is exposed in the opening part 360x. The part of the wiring layer 350 exposed in the opening part 360x constitutes a pad 350p. The pad 350p is electrically connected to the pad 12p of the built-in electronic component substrate 1 interposed by the external connection terminal 200 such as a solder ball.

The semiconductor chip 410 is layered on the solder resist layer 340 of the wiring substrate 310 in a face-up state. An electrode pad (not illustrated) of the semiconductor chip 410 is electrically connected to the pad 330*p* of the wiring substrate 310 by way of a bonding wire 420.

The semiconductor chip 430 is layered on apart of the semiconductor chip 410 on which no electrode pad is formed. The semiconductor chip 430 is layered in a face-up state. An electrode pad (not illustrated) of the semiconductor chip 430 is electrically connected to the pad 330*q* of the wiring substrate 310 by way of a bonding wire 440. The semiconductor chip 410, the bonding wire 420, the semiconductor chip 430, and the bonding wire 440 are encapsulated by the encapsulating resin 450 provided on the solder resist layer 340 of the wiring substrate 310.

Thereby, the semiconductor package 100 having the semiconductor package 300 mounted on the built-in electronic component substrate 1 can be obtained. For example, the semiconductor chip 50 installed in the built-in electronic component substrate 1 can be a logic type semiconductor chip whereas the semiconductor chips 410, 430 mounted on the semiconductor package 300 can be memory type semiconductor chips. It is to be noted that the number of semiconductor chips mounted on the semiconductor package 300 is not limited to two semiconductor chips. For example, one semiconductor chip or three or more semiconductor chips may be mounted on the semiconductor package 300.

Hence, with the above-described embodiment of the present invention, there can be provided a built-in electronic component substrate enabling its thickness to be reduced.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

For example, a built-up substrate having more wiring layers and/or insulating layers than the first or the second substrate 10, 30 may be used as the first or the second substrates 10, 30. In this case, a coreless built-up substrate may be used as the first or the second substrates. Alternatively, a silicon substrate or a ceramic substrate may be used as the first or the second substrate 10, 30.

Further, in the processes of manufacturing the built-in electronic component substrate, the resin film 55 may be adhered to the surface of the substrate 10 beforehand, so that the resin film 55 can be adhered (attached) to the back surface of the semiconductor chip 50 and the end surfaces of the underfill resin 42.

What is claimed is:

1. A built-in electronic component substrate comprising:
a first substrate;
an electronic component including side surfaces and mounted on the first substrate;
a first resin provided on the first substrate and covering the side surfaces of the electronic component;
a second substrate provided above the electronic component and the first resin and layered on the first substrate;
a substrate connection member provided between the first and the second substrates and electrically connecting the first and the second substrates;
a second resin filling in between the electronic component and the second substrate and in between the first resin and the second substrate; and
a third resin filling in between the first and the second substrates and encapsulating the substrate connection member, the electronic component, the first resin, and the second resin,
wherein the second substrate and the second resin are in direct physical contact with each other, and the electronic component and the second resin are in direct physical contact with each other.

2. The built-in electronic component substrate as claimed in claim 1,
wherein the electronic component includes an upper surface,
wherein the first resin includes an upper surface,
wherein the upper surface of the electronic component is exposed from the upper surface of the first resin,
wherein the upper surface of the electronic component and the upper surface of the first resin are flush with each other.

3. The built-in electronic component substrate as claimed in claim 1,
wherein the electronic component is a semiconductor chip,
wherein the semiconductor chip includes a circuit forming surface,
wherein the semiconductor chip is flip-chip bonded to the first substrate in a state where the circuit forming surface faces toward the first substrate,
wherein the first resin fills in between the circuit forming surface and the first substrate.

4. The built-in electronic component substrate as claimed in claim 1,
wherein the substrate connection member includes a core and a conductive member covering an outer peripheral surface of the core,
wherein the first substrate includes a first pad,
wherein the second substrate includes a second pad,
wherein the core contacts the first pad and the second pad.

5. The built-in electronic component substrate as claimed in claim 4,
wherein the second pad includes a height increasing part protruding toward the first substrate.

6. A built-in electronic component substrate comprising:
a first substrate;
an electronic component including side surfaces and mounted on the first substrate;
a first resin provided on the first substrate and covering the side surfaces of the electronic component;
a second substrate provided above the electronic component and the first resin and layered on the first substrate;
a substrate connection member provided between the first and the second substrates and electrically connecting the first and the second substrates;
a second resin filling in between the electronic component and the second substrate and in between the first resin and the second substrate; and
a third resin filling in between the first and the second substrates and encapsulating the substrate connection member, the electronic component, the first resin, and the second resin,
wherein the second substrate includes a solder resist layer including an opening part,
wherein the second resin fills in between the electronic component and the opening part and in between the first resin and the opening part.

7. The built-in electronic component substrate as claimed in claim 6,
wherein the electronic component includes an upper surface, wherein the first resin includes an upper surface, wherein the upper surface of the electronic component is exposed from the upper surface of the first resin, wherein the upper surface of the electronic component and the upper surface of the first resin are flush with each other.

8. The built-in electronic component substrate as claimed in claim 6, wherein the electronic component is a semiconductor chip, wherein the semiconductor chip includes a circuit forming surface, wherein the semiconductor chip is flip-chip bonded to the first substrate in a state where the circuit forming surface faces toward the first substrate, wherein the first resin fills in between the circuit forming surface and the first substrate.

9. The built-in electronic component substrate as claimed in claim 6, wherein the substrate connection member includes a core and a conductive member covering an outer peripheral surface of the core, wherein the first substrate includes a first pad, wherein the second substrate includes a second pad, wherein the core contacts the first pad and the second pad.

10. The built-in electronic component substrate as claimed in claim 9, wherein the second pad includes a height increasing part protruding toward the first substrate.

11. A method for manufacturing a built-in electronic component substrate, the method comprising:

mounting an electronic component including side surfaces on a first substrate along with forming a first resin that covers the side surfaces of the electronic component on the first substrate;

laminating a second resin in a semi-cured state on the electronic component and on the first resin;

mounting a substrate connection member on a second substrate;

electrically connecting the first and second substrates interposed by the substrate connection member along with supplying the second resin to fill in between the electronic component and the second substrate and in between the first resin and the second substrate; and supplying a third resin that encapsulates the substrate connection member, the electronic component, the first resin, and the second resin between the first and second substrates.

12. The method of claim 11, wherein the electrically connecting of the first and second substrates and the supplying of the second resin are performed by positioning the electronic component, the first resin, and the substrate connection member to face an inward direction of the built-in electronic component substrate, layering the second substrate on the first substrate, and pressing the second substrate toward the first substrate while heating the substrate connection member and the second resin.

13. The method of claim 11, wherein the forming of the first resin includes laminating the first resin in a semi-cured state on the first substrate, electrically connecting the electronic component and the first substrate along with forming the first resin that exposes an upper surface of the electronic component and covers the side surfaces of the electronic component, wherein the electrically connecting of the electronic component and the first substrate and the forming of the first resin is performed by pressing the electronic component into the first resin in the semi-cured state from above the first resin.

14. The method of claim 11, wherein the forming of the first resin includes forming the first resin, so that an upper surface of the electronic component and an upper surface of the first resin are flush with each other.

15. The method of claim 11, wherein the electronic component is a semiconductor chip including a circuit forming surface, wherein the forming of the first resin includes flip-chip bonding the circuit forming surface to the first substrate and supplying the first resin to fill in between the circuit forming surface and the first substrate.

* * * * *